United States Patent
Zhai et al.

(10) Patent No.: US 10,624,235 B2
(45) Date of Patent: Apr. 14, 2020

(54) APPARATUS INTEGRATED WITH COOLING COMPONENTS AND MAINTAINING METHOD THEREOF

(71) Applicant: EMC IP Holding Company LLC, Hopkinton, MA (US)

(72) Inventors: Haifang Zhai, Shanghai (CN); Hendry Xiaoping Wu, Shanghai (CN); Yujie Zhou, Shanghai (CN); David Dong, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/383,856

(22) Filed: Apr. 15, 2019

(65) Prior Publication Data
US 2019/0335615 A1 Oct. 31, 2019

(30) Foreign Application Priority Data
Apr. 28, 2018 (CN) .......................... 2018 1 0402529

(51) Int. Cl.
*H05K 7/20* (2006.01)
*G11B 33/04* (2006.01)
*G11B 33/14* (2006.01)

(52) U.S. Cl.
CPC ..... *H05K 7/20172* (2013.01); *G11B 33/0405* (2013.01); *G11B 33/142* (2013.01); *H05K 7/20736* (2013.01); *F25B 2500/25* (2013.01); *F25B 2500/27* (2013.01)

(58) Field of Classification Search
USPC .......................................... 361/695
See application file for complete search history.

(56) References Cited

U.S. PATENT DOCUMENTS

| | | | | |
|---|---|---|---|---|
| 6,040,981 A * | 3/2000 | Schmitt | ..................... | G06F 1/18 312/221 |
| 6,317,320 B1 * | 11/2001 | Cosley | ............... | H05K 7/20581 174/15.1 |
| 6,587,342 B1 * | 7/2003 | Hsu | ........................... | G06F 1/20 165/80.3 |
| 7,054,155 B1 * | 5/2006 | Mease | ................ | H05K 7/20581 165/104.34 |
| 7,413,402 B2 * | 8/2008 | Kang | ................. | H05K 7/20172 361/695 |
| 7,580,259 B2 * | 8/2009 | Hsiao | ....................... | G06F 1/20 361/679.48 |

(Continued)

*Primary Examiner* — Binh B Tran
*Assistant Examiner* — Krystal Robinson
(74) *Attorney, Agent, or Firm* — Ryan, Mason & Lewis, LLP

(57) ABSTRACT

The present disclosure provides an apparatus integrated with cooling components. The apparatus comprises heat generating components and cooling components for delivering a cooling airflow to the heat generating components. The cooling components are arranged along one side of the apparatus and upstream of the heat generating components along a direction of the airflow generated by the cooling components. The cooling components are rotatable towards an outside of the apparatus to expose the heat generating components. The apparatus integrated with cooling components of the present disclosure can effectively improve the maintenance efficiency of the cooling components and other important components.

20 Claims, 16 Drawing Sheets

(56) References Cited

U.S. PATENT DOCUMENTS

| | | | | |
|---|---|---|---|---|
| 8,064,199 B2* | 11/2011 | Lin | | G06F 1/185 |
| | | | | 361/679.31 |
| 8,451,605 B2* | 5/2013 | Chen | | H05K 7/20172 |
| | | | | 361/679.48 |
| 8,625,276 B2* | 1/2014 | Chen | | G06F 1/20 |
| | | | | 361/679.48 |
| 8,720,532 B2* | 5/2014 | Malone | | H05K 7/20727 |
| | | | | 165/121 |
| 8,730,662 B2* | 5/2014 | Wang | | G06F 1/20 |
| | | | | 312/236 |
| 9,066,444 B2* | 6/2015 | Adrian | | H05K 7/20172 |
| 9,179,576 B2* | 11/2015 | Du | | G06F 1/20 |
| 9,307,677 B2* | 4/2016 | Huang | | H05K 7/20727 |
| 9,395,073 B2* | 7/2016 | Sato | | H01L 23/467 |
| 9,976,559 B2* | 5/2018 | Shih | | F04D 19/002 |
| 9,999,161 B2* | 6/2018 | Mease | | H05K 7/20172 |
| 10,165,696 B1* | 12/2018 | Blasingame | | H05K 5/0221 |
| 10,312,727 B2* | 6/2019 | Kobayashi | | H02J 7/0068 |
| 10,330,118 B2* | 6/2019 | Zhu | | F04D 29/601 |
| 2005/0249603 A1* | 11/2005 | Kang | | F04D 29/601 |
| | | | | 416/244 R |
| 2006/0256522 A1* | 11/2006 | Wei | | H05K 7/20581 |
| | | | | 361/695 |
| 2006/0285292 A1* | 12/2006 | Fan | | H05K 7/20172 |
| | | | | 361/695 |
| 2009/0154092 A1* | 6/2009 | Chen | | G06F 1/187 |
| | | | | 361/679.51 |
| 2009/0244841 A1* | 10/2009 | Takasou | | B60R 11/02 |
| | | | | 361/695 |
| 2011/0063799 A1* | 3/2011 | Takahasi | | F04D 25/08 |
| | | | | 361/695 |
| 2011/0067836 A1* | 3/2011 | Tang | | F04D 25/166 |
| | | | | 165/67 |
| 2011/0100600 A1* | 5/2011 | Tang | | H01L 23/467 |
| | | | | 165/96 |
| 2011/0216498 A1* | 9/2011 | Lee | | G06F 1/20 |
| | | | | 361/679.33 |
| 2012/0211292 A1* | 8/2012 | Werner | | B60K 11/04 |
| | | | | 180/68.1 |
| 2014/0233185 A1* | 8/2014 | Wen | | H05K 7/20172 |
| | | | | 361/695 |
| 2015/0016059 A1* | 1/2015 | Esmaily | | H05K 7/20736 |
| | | | | 361/695 |
| 2015/0167691 A1* | 6/2015 | Chen | | H05K 7/20172 |
| | | | | 415/108 |
| 2015/0282384 A1* | 10/2015 | Ho | | H05K 7/20172 |
| | | | | 361/695 |
| 2015/0351280 A1* | 12/2015 | Gonzalez Inda | | H05K 7/20172 |
| | | | | 361/695 |
| 2016/0029519 A1* | 1/2016 | Chen | | H05K 7/20727 |
| | | | | 361/679.48 |
| 2016/0146218 A1* | 5/2016 | Schulze | | F04D 25/08 |
| | | | | 415/1 |

* cited by examiner

APPARATUS INTEGRATED WITH COOLING COMPONENTS AND MAINTAINING METHOD THEREOF

RELATED APPLICATION(S)

The present application claims priority to Chinese Patent Application No. 201810402529.4, filed Apr. 28, 2018, and entitled "Apparatus Integrated with Cooling Components and Maintaining Method Thereof," which is incorporated by reference herein in its entirety.

FIELD

Various embodiments of the present disclosure relate to the field of heat dissipation, and more specifically, to an apparatus integrated with cooling components and a maintaining method thereof.

BACKGROUND

Heat dissipation is an important problem for electronic and/or electrical devices. In some cases, the working temperature of the electronic devices directly determines its service life and stability. Therefore, cooling components (such as fan components) are currently employed by many heat generating devices (e.g., disk cabinets), to maintain the working temperature of various components in the device in an appropriate range.

Meanwhile, there are needs to maintain the cooling components and other vital components within the above heat generating devices. Particularly, in case of individual cooling components and/or other important components being in a malfunction state, it is expected to be able to maintain (e.g., replace) these malfunctioned individual cooling components and/or other important components in a convenient manner without affecting normal operation of the other components of the entire device.

SUMMARY

In one aspect of the present disclosure, there is provided an apparatus integrated with cooling components. The apparatus comprises heat generating components and cooling components for delivering a cooling airflow to the heat generating components. The cooling components are arranged along one side of the apparatus and upstream of the heat generating components along a direction of airflow generated by the cooling components. The cooling components are rotatable toward an outside of the apparatus to expose the heat generating components.

In some embodiments, the apparatus integrated with cooling components further comprises a rotary connecting structure arranged to detachably connect the cooling components to a bottom plate of the apparatus.

In some embodiments, the rotary connecting structure comprises a rotating rod secured onto the bottom plate of the apparatus and pivotally connecting the cooling components to the bottom plate.

In some embodiments, the apparatus integrated with cooling components further comprises a plurality of baffles, with at least one of the baffles arranged on each side of each of the cooling components, where during rotation of the cooling components towards the outside of the apparatus, the baffles are operable to slide to laterally close a gap space between the respective cooling components and the heat generating components.

In some embodiments, the rotary connecting structure further comprises a plurality of draw bars for connecting the cooling components to the plurality of baffles. Each draw bar is secured onto the cooling component on one end and slidably mounted in a slot on the baffle on the other end.

In some embodiments, the rotary connecting structure further comprises a lateral rod disposed at a bottom of the cooling components, wherein two ends of the lateral rod respectively protrude from respective vias at two sides of the cooling components and are connected to the draw bars located at the two sides of the cooling components.

In some embodiments, the rotary connecting structure further comprises a control rod arranged to apply a releasing operation on at least one of the rotating rod and the lateral rod to release the cooling components from the rotating rod and/or the lateral rod, such that the cooling components are decoupled from the rotary connecting structure.

In some embodiments, the rotating rod and the lateral rod each comprise springs provided therein. The springs are capable of causing two ends of the rotating rod and the lateral rod to retract inwardly in response to the releasing operation of the control rod, so that the cooling components are decoupled from the rotary connecting structure.

In some embodiments, the heat generating components and the cooling components are arranged between the bottom plate and a top plate parallel with the bottom plate. The heat generating components are detachably connected to the top plate via a snap-fit structure.

In some embodiments, the apparatus integrated with cooling components further comprises an interface circuit board comprising an interface extending in proximity to the cooling components and supporting hot-plug connection with the cooling components.

In some embodiments, the cooling components comprise fan components, and the heat generating components comprise storage.

In some embodiments, the plurality of cooling components is arranged in rows along one side of the apparatus, where each of the cooling components corresponds to a plurality of heat generating components.

In some embodiments, the apparatus is a disk cabinet.

In another aspect of the present disclosure, there is provided an electronic or electrical device comprising the apparatus integrated cooling components described above.

In a further aspect of the present disclosure, there is provided a method for maintaining the apparatus comprising heat generating components and cooling components disposed along one side of the apparatus, wherein the cooling components are disposed upstream of the heat generating components along a direction of the airflow generated by the cooling components. The method comprises flipping the cooling components towards outside of the apparatus and decoupling the cooling components or the heat generating components from a housing of the apparatus.

BRIEF DESCRIPTION OF THE DRAWINGS

In the drawings, similar/same reference numerals throughout different views generally represent similar/same parts. Drawings are not necessarily on scale. Rather, emphasis is placed upon the illustration of the principles of the present invention.

DETAILED DESCRIPTION

Figure 1:
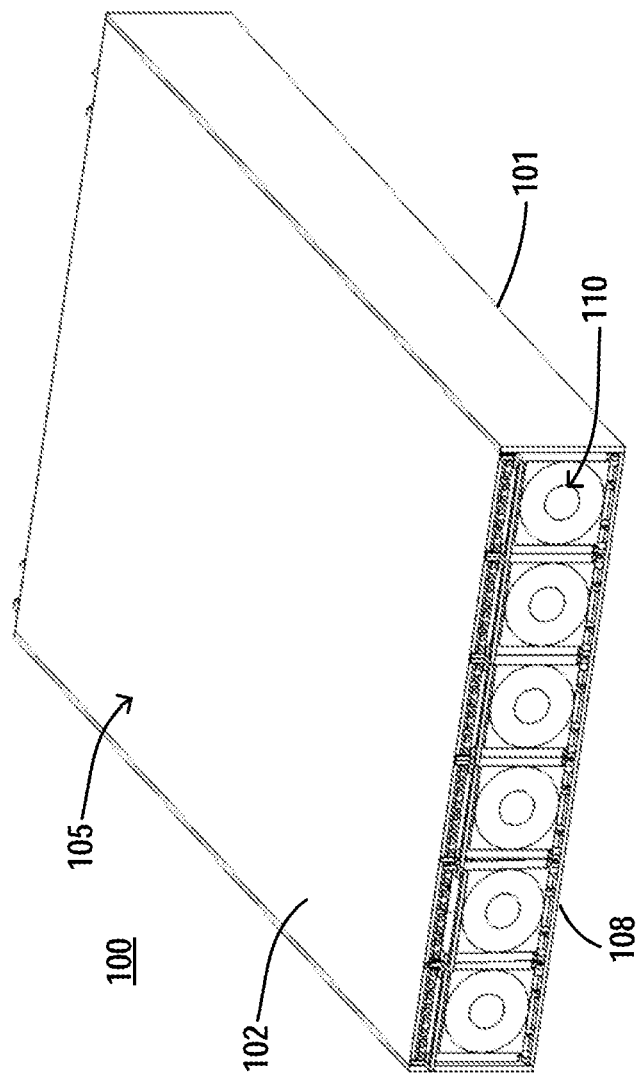
FIG. 1 illustrates a schematic diagram of a housing of an apparatus integrated with cooling components according to one embodiment of the present disclosure.

Principles of the present disclosure are now explained with reference to various example embodiments shown in the drawings. It should be appreciated that description of those embodiments is merely to enable those skilled in the art to better understand and further implement the present disclosure and is not intended to limit the scope disclosed herein in any manner. It should be noted that similar or same reference numerals can be used in the drawings where applicable, and similar or same reference numerals can represent similar or same functions. Those skilled in the art would easily recognize from the following description that alternative embodiments of the structure and method described in the text can be adopted without deviating from the principles of the present invention described herein.

Conventional thermal designs for electronic devices (such as disk cabinets) or electrical devices integrated with cooling component (e.g., fan components) arrays generally takes the following two forms: one is integrating the array of the cooling components to a main control circuit board of the device; the other is placing the array of the cooling components at the center of the housing of the electronic device. However, the two design methods have respective defects during maintenance. For the first design, when the components on the main control circuit board are maintained, it might be required to terminate the operation of the cooling components mounted thereon, which is unfavorable for other operating components in need of heat dissipation. For the second design, it is required to open a top plate of the housing of the electronic device. Opening the top plate, however, is extremely inconvenient for an electronic device, on which other electronic devices of the same type or different type might be stacked. Alternatively, quite intricate guide rails are required to remove the malfunctioned cooling components from the housing, which undoubtedly increases complexity and costs of the design.

The concept of the present disclosure herein is to dispose the array of cooling components (such as fan components) at an end (e.g., the front end) of the housing of the heat generating device, at which end a user can manipulate them directly, and to design a flip structure for the cooling components to realize convenient maintenance of the cooling components and the heat generating components at the rear end. Design principles of the apparatus integrated with cooling components of the present disclosure will be described in detail below with reference to the drawings.

FIG. 1 illustrates a schematic diagram of a housing of an apparatus integrated with cooling components according to one embodiment of the present disclosure.

As shown in FIG. 1, by way of example, the apparatus 100 integrated with cooling components can include a housing 105, which, for example, can include a bottom plate 101 and a top plate 102. The cooling components 110, such as fan components, and other components can be arranged within the housing 105. To facilitate the maintenance of the cooling components 110, the cooling components 110 can be configured to mount along one side of the housing 105, and the cooling components 110 can be manipulated directly from the outside. It should be noted that although FIG. 1 illustrates a specific number of cooling components 110 and a housing 105 in a particular shape, these are definitely not limitations. In other embodiments, the number of cooling components 110 and the shape of the housing 105 can be designed from application to application.

Figure 2:
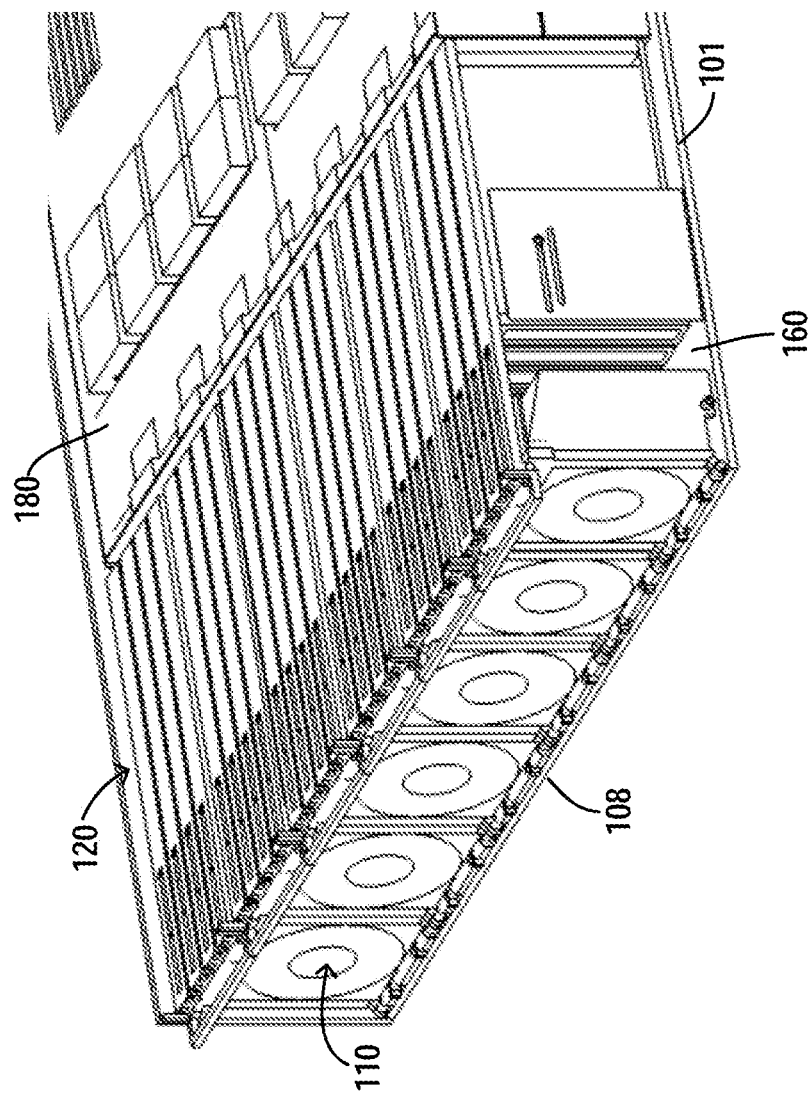
FIG. 2 illustrates a detailed schematic diagram of an internal structure of an apparatus integrated with cooling components according to one embodiment of the present disclosure.

FIG. 2 further illustrates a detailed schematic diagram of the internal structure of an apparatus integrated with cooling components according to one embodiment of the present disclosure. As shown in FIG. 2, the cooling components 110 (such as fan components) can be arranged in rows along one side 108 of the apparatus 100 integrated with cooling components to form an array of the cooling components 110. The array of the cooling components 110 can generate cooling airflows during operation. The array of heat generating components 120 (such as storage devices, e.g., hard disks, that are in need of heat dissipation) can be arranged downstream of the airflow generated by the array of the cooling components 110. In some embodiments, the array of the cooling components 110 and the array of the heat generating components 120 are disposed at a distance from each other to form a gap space 160. The presence of the gap space 160 allows the array of the cooling components 110 to generate a relatively high-speed airflow, so as to more efficiently cool down the heat generating components 120 downstream.

The housing of the apparatus 100 also can be provided with a main control circuit board 180 therein. The main control circuit board 180 can be arranged at the rear end of the heat generating components 120 (e.g., storage devices) and can be appropriately connected to the heat generating components 120 and cooling components 110 at the front end, to control their operation. The housing of the apparatus 100 also can be provided with other electronic or electrical components therein, such as I/O components, memory components, etc. It should be understood that in some embodiments, the main control circuit board 180 and other electronic or electrical components also can exist as heat generating components 120 or a part of the heat generating components.

During the operation of the cooling components 110, the cooling airflow generated will first enter the housing through one end of the housing 105 of the apparatus 100 and then pass through the heat generating components 120, the main control circuit board 180 and other electronic or electrical components and finally exit from another end of the housing 105, so as to sufficiently cool down each component inside the housing 105 of the apparatus 100.

Figure 3:
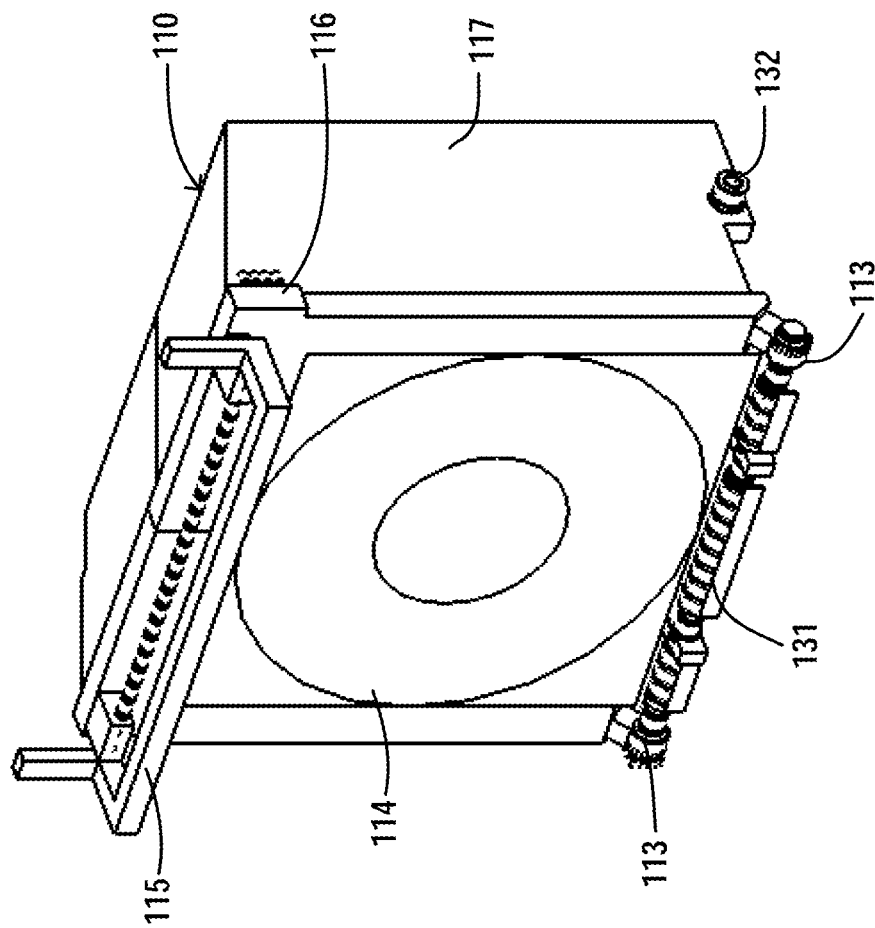
FIG. 3 illustrates a three-dimensional schematic diagram of an integral structure of a cooling component according to one embodiment of the present disclosure.

FIG. 3 illustrates a three-dimensional schematic diagram of an integral structure of a cooling component according to one embodiment of the present disclosure. According to FIG. 3, the cooling component 110 (such as a fan component) may include an airflow generating component 114 (e.g., a fan) at the center and a housing 117 at least partially surrounding the airflow generating component 114. The housing 117 may further include structures for coupling with some parts of a rotary connecting structure 130 (FIG. 4), such as a rotating rod 131, a lateral rod 132 or the like, as will be further discussed below, so as to enable the rotation of the cooling components 110.

Figure 4:
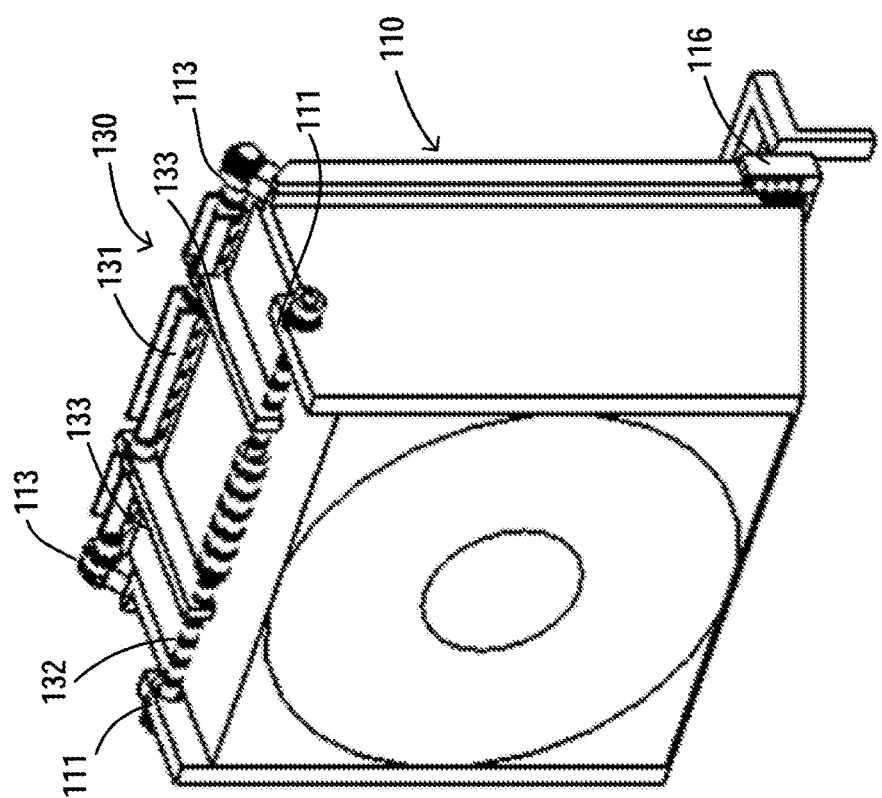
FIG. 4 illustrates a three-dimensional schematic diagram of a bottom structure of a cooling component according to one embodiment of the present disclosure.

FIG. 4 further illustrates a three-dimensional schematic diagram of a bottom structure of a cooling component according to one embodiment of the present disclosure. As shown in FIG. 4, the housing 117 may further include two rings 113 for accommodating two ends of the rotating rod 131 of the rotary connecting structure 130. The two rings 113 are disposed along an edge of the bottom of the housing 117 and the two ends of the rotating rod 131 may respectively protrude from the two rings 113, so as to realize connection between the rotating rod 131 of the rotary connecting structure 130 and the housing 117 of the cooling components 110.

The housing 117 may further include two vias 111 for accommodating two ends of the lateral rod 132 of the rotary connecting structure 130, wherein the two vias are substantially disposed at a middle position of the bottom of the housing 117 and the two ends of the lateral rod 132 may respectively protrude from the two vias 111, so as to realize the connection between the lateral rod 132 of the rotary connecting structure 130 and the housing 117 of the cooling components 110.

It should be noted that the above rotating rod 131 and the lateral rod 132 may be detachably connected to the bottom of the cooling components 110. To this end, in some embodiments, the middle part of the rotating rod 131 and the lateral rod 132 may be respectively provided with, for example, a compressible spring (not shown). In this case, the two ends of the rotating rod 131 and the lateral rod 132 are respectively capable of retracting inward by means of a further compression of the above spring by the user for example, thereby realizing the mounting and/or releasing of the two ends of the rotating rod 131 to and/or from the rings 113 at the bottom edge of the housing 117, and the mounting and/or releasing of the two ends of the lateral rod 132 to/from the vias 111 substantially at a middle position of the bottom of the housing 117. Although the mounting and/or releasing of the two ends of the rotating rod 131 and the lateral rod 132 to and/or from the bottom of the housing 117 by a compressible spring are described above, it will be understood that in some other embodiments, those skilled in the art may adopt other mounting and/or releasing manners, such as clipping manners, apart from the compressible spring.

To further facilitate the detachable mounting and/or releasing of the rotating rod 131 and the lateral rod 132 to and/or from the bottom of the cooling components 110, in some embodiments, the rotating rod 131 and the lateral rod 132 may be disposed substantially parallel with each other at the bottom of the housing 117, and two control rods 133 may be mounted therebetween. Accordingly, users may compress the springs disposed on the rotating rod 131 and the lateral rod 132 by pressing the two control rods 133, so as to perform the mounting and/or releasing of the two ends of the rotating rod 131 and the lateral rod 132 to and/or from the bottom of the housing 117. Similarly, it will be understood that the above number of the control rods 133 and the mounting and/or releasing manner are only exemplary and those skilled in the art may employ other forms and/or numbers of control rods 133 in other embodiments.

In some embodiments, the cooling components 110 may further include a handle 115 (FIG. 3) to facilitate rotating operations of the cooling components 110. As an example, the handle 115 may be located at one side of the cooling components 110 opposite to the other side where the rotating rod 131 is mounted. In some embodiments, the cooling components 110 may further include a hot pluggable interface 116 to facilitate the power supply and the control connection of the cooling components 110. For example, the hot pluggable interface 116 may be located at a top corner of the cooling components 110.

Figure 5:
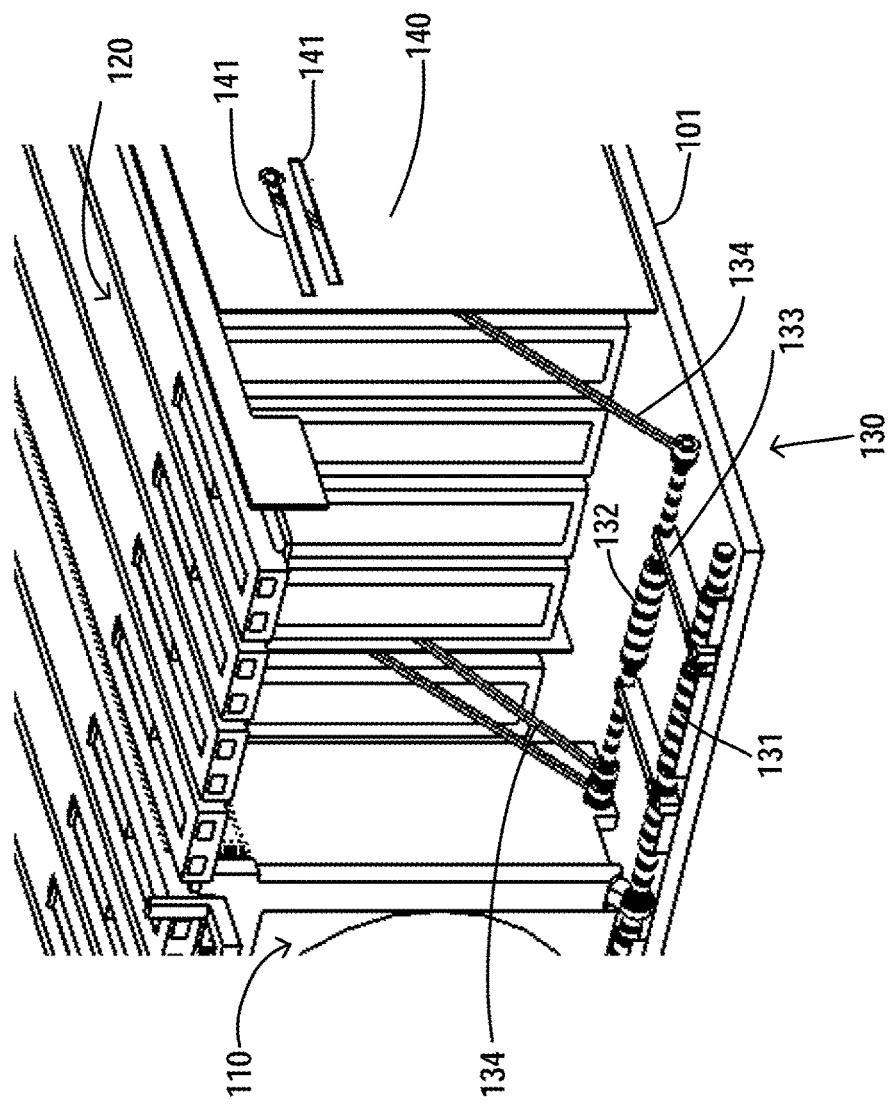
FIG. 5 illustrates a schematic diagram of a rotary connecting structure inside a housing of an apparatus integrated with cooling components according to one embodiment of the present disclosure.

FIG. 5 further illustrates a schematic diagram of a rotary connecting structure 130 inside a housing of an apparatus integrated with cooling components according to one embodiment of the present disclosure, wherein the mounted cooling components related to the shown rotary connecting structure are removed for the sake of clarity. In FIG. 5, the rotating rod 131 in the rotary connecting structure 130 is secured onto the bottom plate 101 of the housing, but still maintains the rotation ability. The lateral rod 132 and the control rod 133 are fixedly connected with each other with respect to the rotating rod 131 and may rotate along with the rotation of the rotating rod 131. In FIG. 5, a non-rotating state of the lateral rod 132 and the control rod 133 is illustrated. At this time, the lateral rod 132 and the control rod 133 abut against the bottom plate 101 of the housing of the cooling components 110 and may be supported by the bottom plate 101 of the housing.

The rotary connecting structure 130 also may further include a draw bar 134. The two sides of each rotary connecting structure 130 are respectively provided with a draw bar 134. One end of each draw bar 134 is detachably connected to one end of the lateral rod 132 and the other end of the draw bar is slidably connected in a slot 141 of a baffle 140. Accordingly, the baffle 140, when driven by the draw bar 134, may slide in a direction towards the cooling components 110 along with an outward rotation of the lateral rod 132, so as to close the gap space 160 (FIG. 2) defined between the cooling components 110 and the heat generating components 120. Or, the baffle 140, when driven by the draw bar 134, may slide in a direction towards the heat generating components 120 along with an inward rotation of the lateral rod 132, so as to open the gap space 160 defined between the cooling components 110 and the heat generating components 120.

FIG. 5 illustrates a non-rotation state of the rotary connecting structure 130, i.e., a non-rotation state of corresponding cooling components 110 mounted thereon. In this state, the baffle 140 will retract between the adjacent heat generating components 120 and basically does not extend to the gap space 160. Therefore, in this state, the gap space 160 between the cooling components 110 and the heat generating components 120 is in connection with the adjacent gap space. By contrast, in the case that a cooling component 110 gradually rotates outward, the corresponding baffle 140 will be driven by the respective draw bar 134, and gradually slide in a direction towards the cooling components 110 and the gap space 160 defined between the cooling components 110 and the heat generating components 120 will gradually close. At this time, the gap space 160 between the cooling components 110 and the heat generating components 120 will be isolated from the adjacent gap space, which will be further explained below with reference to FIGS. 12-14.

It should be explained that in some embodiments, the two draw bars 134 may respectively be located at two sides of a corresponding cooling component 110, so as not to block the flip of the cooling component 110. In some embodiments, the two adjacent cooling components 110 may share one baffle 140, which may save the number of baffles employed in the apparatus 100. When the two adjacent cooling components 110 share one baffle 140, the wall of the shared baffle 140 may be provided with two slots 141, which may be respectively utilized by the draw bars 134 of the two adjacent cooling components 110.

Figure 6:
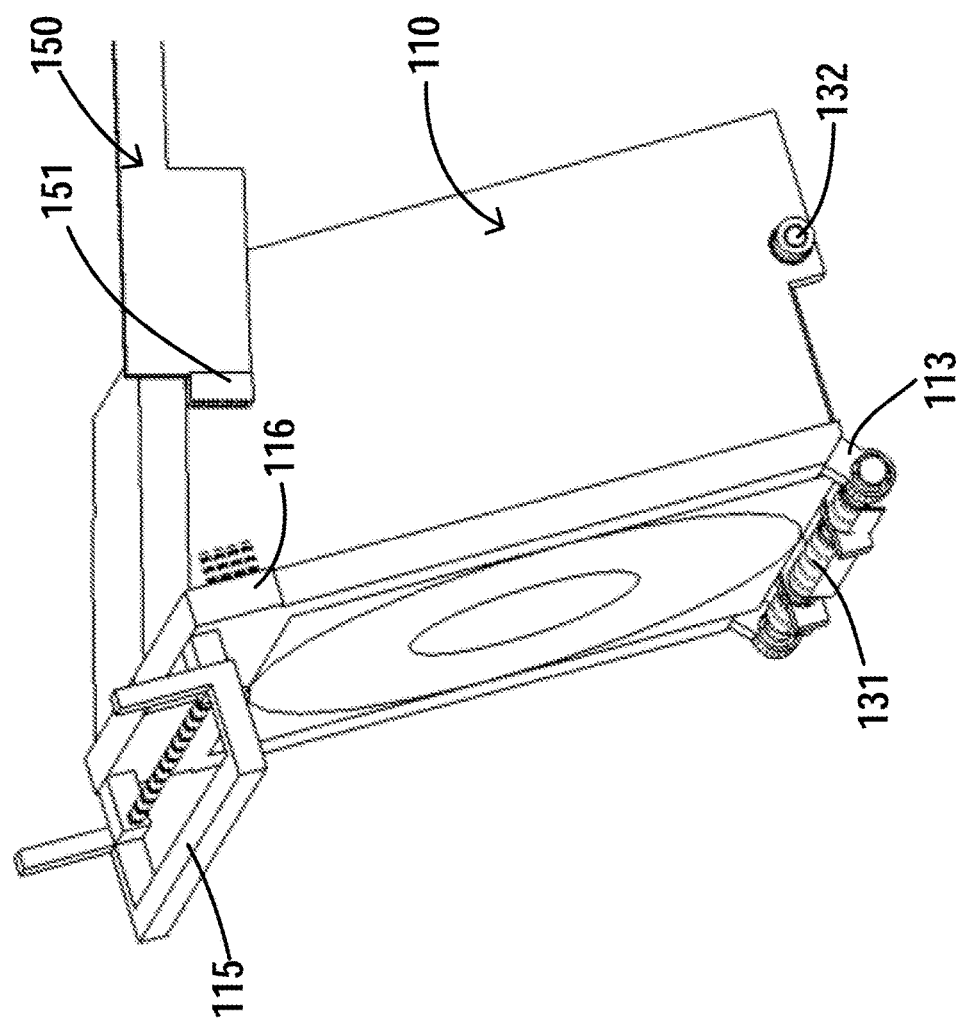
FIG. 6 illustrates a schematic diagram of the disconnection between a cooling component and an interface circuit board according to one embodiment of the present disclosure.

FIG. 6 illustrates a schematic diagram of the disconnection between a cooling component and an interface circuit board according to one embodiment of the present disclosure. As shown in FIG. 6, the cooling component 110 is provided with a hot pluggable interface 116. Accordingly, the apparatus 100 integrated with cooling components is provided with a corresponding interface 151 that may be connected with the hot pluggable interface 116, so as to realize the power supply and control connection for the cooling components 110. In some embodiments, the interface 151 may be arranged on an interface circuit board 150 extending from the rear end of the heat generating components 120 to the vicinity of the cooling component 110, wherein the interface circuit board 150 may be connected to an interface of a main control circuit board (see FIG. 2) at the rear end, which facilitates the power supply and control connection for the cooling components 110. In some embodiments, the interface circuit board 150 may be elongated and extend at an upper end between the adjacent heat generating components 120, such that the arrangement inside the housing of the apparatus 100 becomes more compact.

As shown in FIG. 6, when the cooling component 110 is in a state of rotating outward, the hot pluggable interface 116 will disconnect from the interface 151 of the interface circuit board 150. The outward rotation state of the cooling component 110 may be done by users pulling the handle 115 outward. Because it is hot pluggable between the cooling component 110 and the interface circuit board 150, users may perform disconnecting operations when the apparatus 100 is in an operating state, so as to maintain the malfunctioned cooling components 110 (e.g., replacement).

Figure 7:
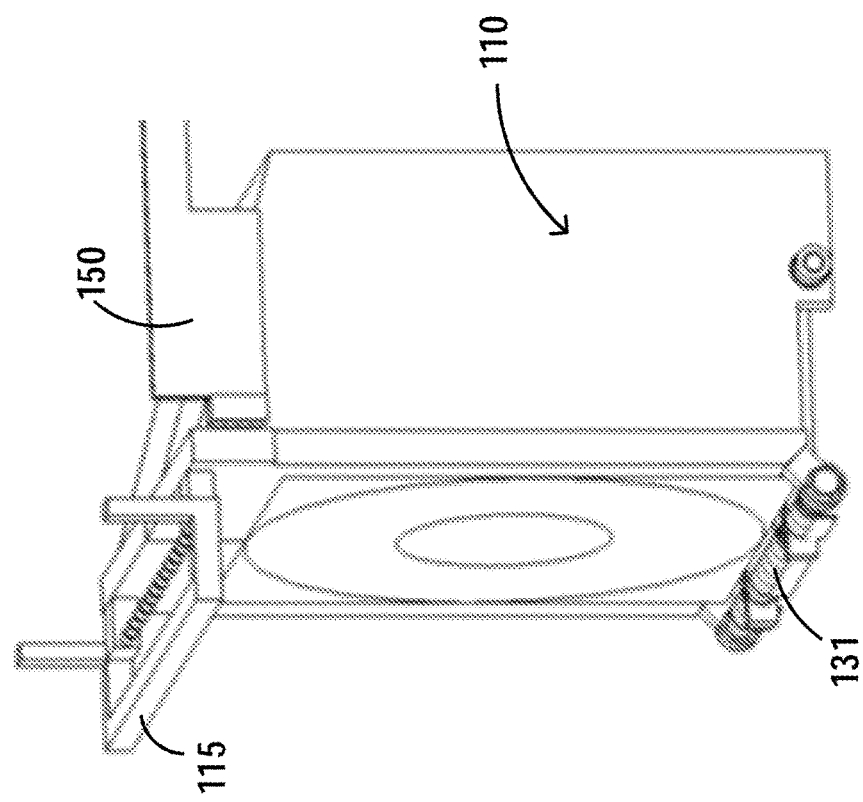
FIG. 7 illustrates a schematic diagram of the connection between a cooling component and an interface circuit board according to one embodiment of the present disclosure.

FIG. 7 illustrates a schematic diagram of the connection between a cooling component and an interface circuit board according to one embodiment of the present disclosure. As shown in FIG. 7, when the cooling component 110 is in a non-rotating state, the hot pluggable interface 116 (FIGS. 3 and 4) will connect with the interface 151 of the interface circuit board 150. In some embodiments, the non-rotating state of the above cooling components 110 also may be done by users pulling the handle 115 inward to rotate the cooling components 110 back to the non-rotating state.

With reference to FIGS. 6 and 7, it can be seen that disconnection and connection between the cooling component 110 and the interface circuit board 150 may be performed by means of rotating operations of the cooling component 110, thereby realizing the power supply and control operations for the cooling components 110, which facilitates the maintenance of the malfunctioned cooling components 110.

Figure 8:
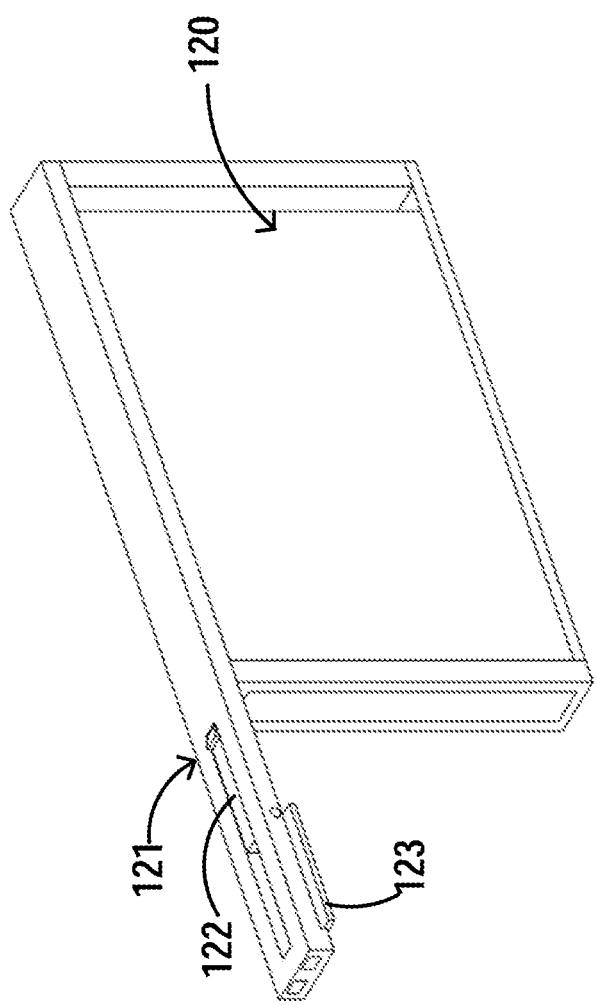
FIG. 8 illustrates a schematic diagram of a heat generating component comprising a snap-fit structure according to one embodiment of the present disclosure.

FIG. 8 illustrates a schematic diagram of a heat generating component comprising a snap-fit structure according to one embodiment of the present disclosure. Merely as an example, the heat generating components 120 in FIG. 8 are substantially rectangular-shaped. In some embodiments, the heat generating components 120, for example, may be hardware components. However, it will be appreciated that in other embodiments, the heat generating components 120 also may be heat generating components having other functions or other shapes.

In some embodiments, as shown in FIG. 8, the heat generating components 120 also may be provided with a snap-fit structure 121. The snap-fit structure 121 may be used for snap-fitting and securing the heat generating components 120 onto the top plate 102 (see FIGS. 1 and 8) of the apparatus 100 integrated with cooling components 110, such that the heat generating components 120 are firmly secured between the top plate 102 and the bottom plate 101. In some embodiments, the snap-fit structure 121 of the heat generating components 120 may extend outward from the housing of the heat generating components 120, for example, may extend on top of the gap space 160 defined between the cooling components 110 and the heat generating components 120, and even may extend above the cooling components 110 (see FIGS. 2 and 8). Such an extending manner may fully expose the snap-fit structure 121 in the case that the cooling components 110 are flipping or being maintained, such that users may manipulate (e.g., unlock) the snap-fit structure 121. Besides, it is convenient for the users to take full advantage of the length of the snap-fit structure 121 to withdraw the heat generating components 120 from the housing of the apparatus 100.

Figure 9:
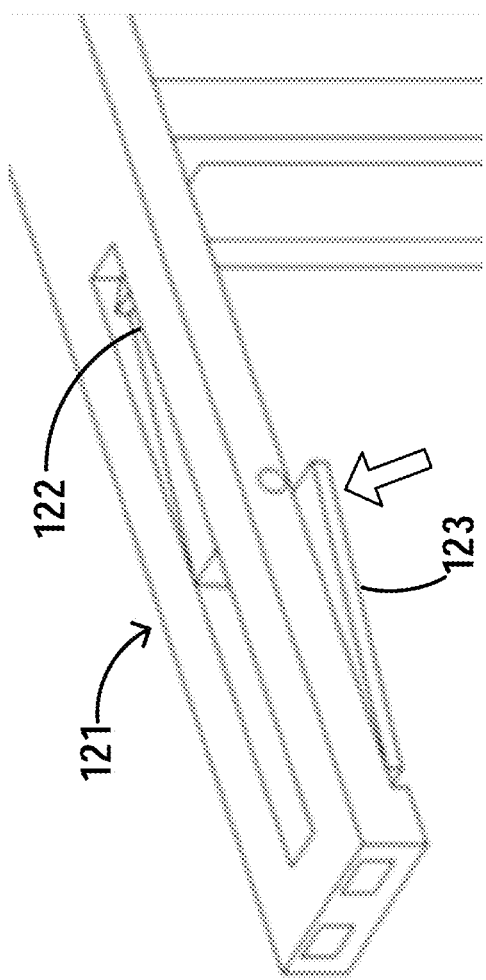
FIG. 9 illustrates an enlarged schematic diagram of a snap-fit structure of the heat generating component according to one embodiment of the present disclosure.

FIG. 9 illustrates an enlarged schematic diagram of a snap-fit structure 121 of the heat generating component 120 according to one embodiment of the present disclosure. As shown in FIG. 9, the snap-fit structure 121 may include a hook 122 and an unlocking button 123. In a locked state, the hook 122 may mate with a slot (not shown) on the top plate 102 of the apparatus 100 integrated with cooling components 110 to secure the heat generating components 120 on the top plate 102. To unlock, the users may detach the hook 122 from the slot on the top plate 102 of the apparatus 100 by pressing the unlocking button 123 on the snap-fit structure 121, so as to realize the detachment between the heat generating components 120 and the top plate 102. When the heat generating components 120 are detached from the top plate 102 of the apparatus 100, the users may withdraw the heat generating components 120 in need of maintenance by pulling the snap-fit structure 121 outward, which will be further described below with reference to FIG. 15.

Figure 10:
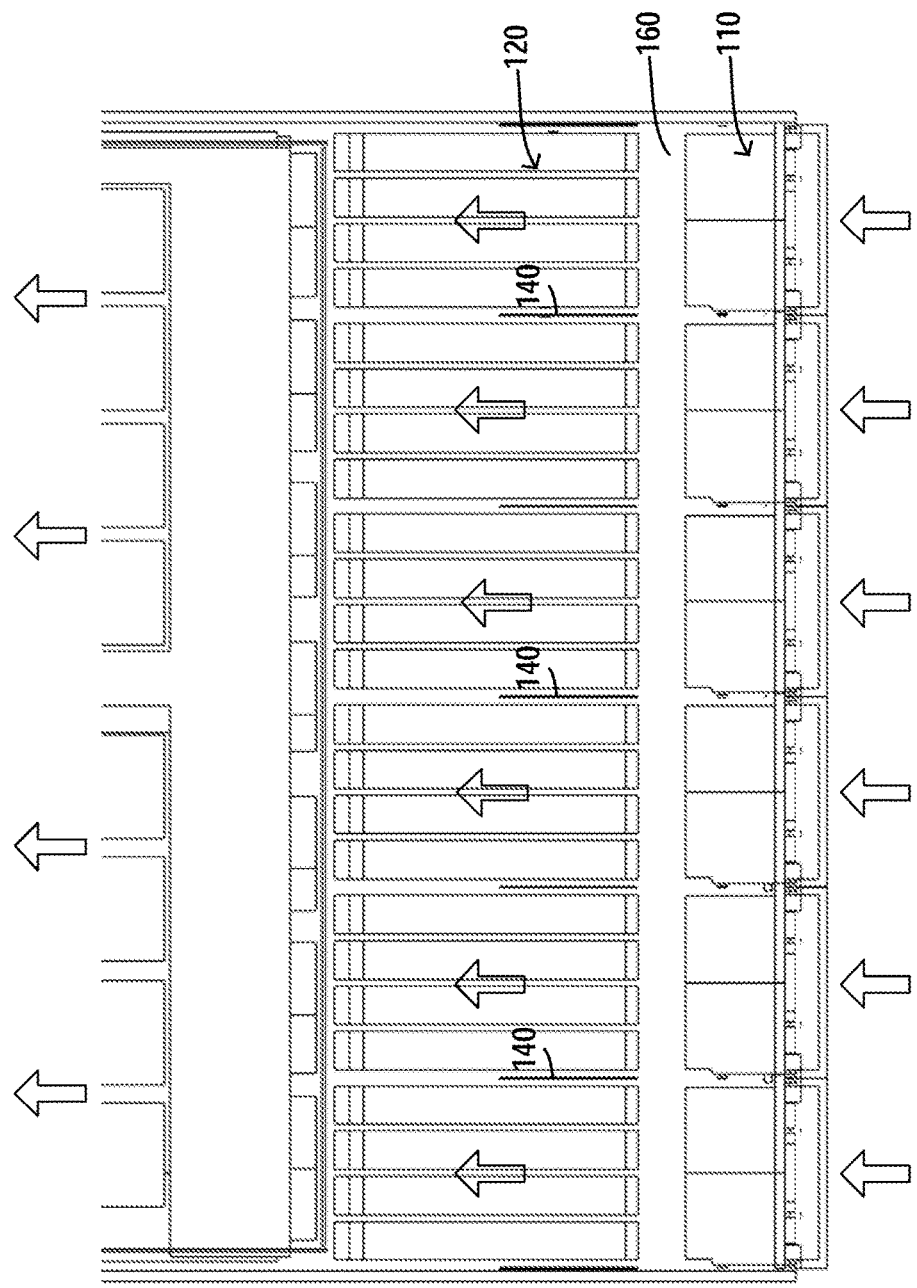
FIG. 10 illustrates a schematic diagram of the airflow of the apparatus integrated with the cooling components in a normal operating state according to one embodiment of the present disclosure.

FIG. 10 illustrates a schematic diagram of the airflow of the apparatus integrated with the cooling components in a normal operating state according to one embodiment of the present disclosure. As shown in FIG. 10, in a normal operating state, the airflow, under the operation of the cooling components 110 (such as fan components), passes through the cooling components 110 from one end of the apparatus 100, enters the housing 105 of the apparatus 100 (see FIG. 1), and then through the gap space 160 between the cooling components 110 and the heat generating components 120. The airflow continues through the heat generating components 120 and other rear-end electronic components (e.g., main control circuit board, I/O card etc.) inside the housing 105, and finally exits the apparatus 100 from the other end of the housing 105 of the apparatus 100. It should be noted that in a normal operating state, each baffle 140 retracts in the gaps between the heat generating components 120 and basically does not extend into the gap space 160 between the cooling components 110 and the heat generating components 120. The schematic diagram of the airflow indicates that the airflow in a normal operating state may sufficiently flow through each component inside the housing of the apparatus 100, thereby effectively dissipating the heat.

Figure 11:
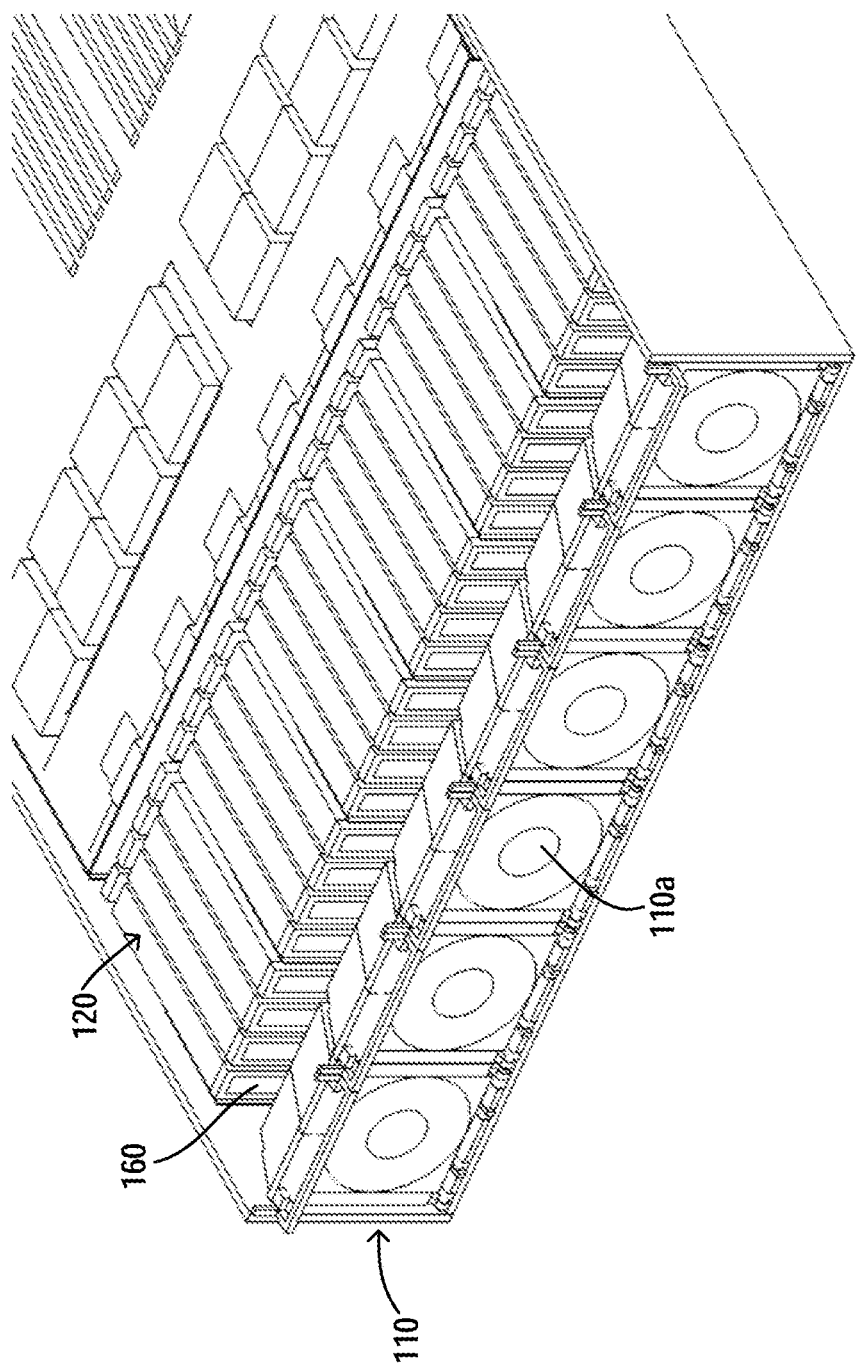
FIG. 11 illustrates a schematic diagram of an apparatus integrated with cooling components when one cooling component therein malfunctions according to one embodiment of the present disclosure.
Figure 12:
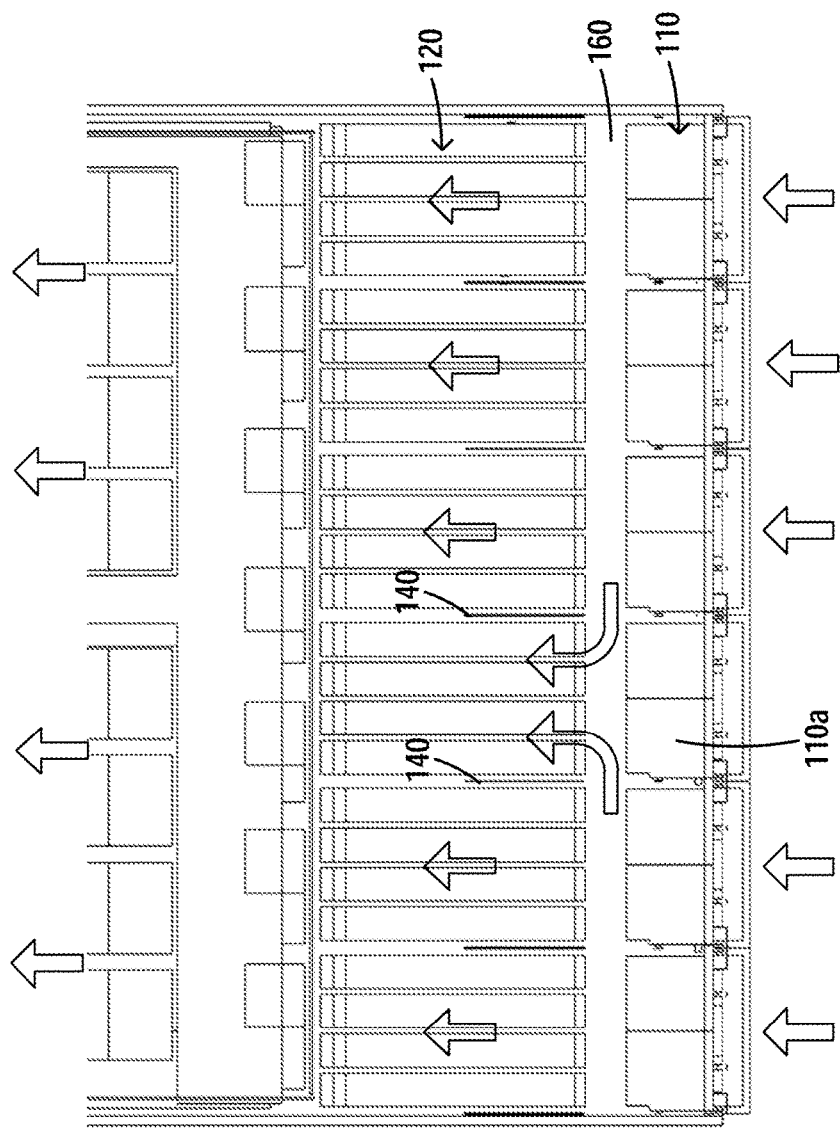
FIG. 12 illustrates a schematic diagram of the airflow of an apparatus integrated with cooling components when one cooling component therein malfunctions according to one embodiment of the present disclosure.

FIG. 11 illustrates a schematic diagram of an apparatus integrated with cooling components when one cooling component 110a therein malfunctions according to one embodiment of the present disclosure; and FIG. 12 illustrates a schematic diagram of the airflow of an apparatus integrated with cooling components when one cooling component 110a therein malfunctions according to one embodiment of the present disclosure.

As shown in FIGS. 11 and 12, when one cooling component 110a in the apparatus 100 integrated with cooling components malfunctions, the cooling component 110a will no longer generate the airflow, i.e., the cooling airflow will no longer pass through the cooling component 110a and enter the housing of the apparatus 100 integrated with the cooling components. Despite that, as the gap space 160 between the cooling component 110a and a corresponding heat generating component 120 is in connection with the adjacent gap space, the airflow from the adjacent gap space still may enter the gap space between the malfunctioned cooling component 110a and the corresponding heat generating component 120, and then pass through the heat generating component 120 corresponding to the malfunctioned cooling component 110a, as indicated by the bending arrows in FIG. 12. Therefore, even if an individual cooling component 110 breaks down, the design of the cooling components 110 and the heat generating components 120 also may guarantee sufficient cooling for all heat generating components 120 inside the housing of the apparatus 100, which effectively improves heat dissipation capability of the apparatus 100 integrated with cooling components in an emergency.

Figure 13:
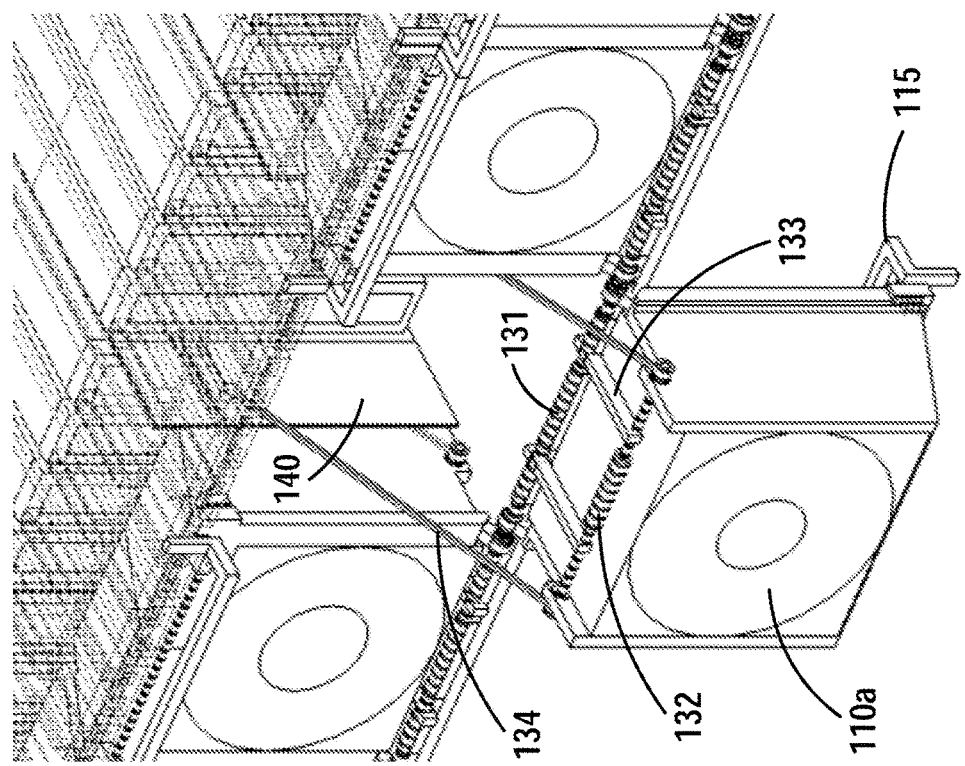
FIG. 13 illustrates a structural diagram of the apparatus integrated with cooling components when one malfunctioned cooling component therein is being maintained according to one embodiment of the present disclosure.

FIG. 13 further illustrates a structural diagram of the apparatus when one malfunctioned cooling component therein is being maintained according to one embodiment of the present disclosure. In practice, the users may maintain (such as repair or replace) the above malfunctioned cooling component 110a. For example, the users may cause the malfunctioned cooling component 110a to flip outward around the rotating rod 131 by means of the handle 115. It should be noted that the baffles 140 at two sides of the malfunctioned cooling component 110a will slide outward along with outward flipping of the malfunctioned cooling component 110a and the lateral sides of the gap space 160 defined between the corresponding cooling component 110 and the heat generating component 120 will be closed.

As shown in FIG. 13, when the above malfunctioned cooling component 110a is in a flipping state, the two ends of the rotating rod 131 and the lateral rod 132 may be operated to respectively retract inward by pressing the control rods 133 inward, such that the cooling component 110a detaches from the rotating rod 131 and the lateral rod 132 to realize the removal or release of the malfunctioned cooling component 110a. Conversely, the two ends of the rotating rod 131 and the lateral rod 132 may be operated to respectively retract inward by pressing the control rods 133 inward, so as to lay the replaced cooling component 110 at respective positions of the two ends of the rotating rod 131 and the lateral rod 132 and then lift the press on the control rods 133 to implement the mounting of the replaced cooling component 110 to the two ends of the rotating rod 131 and the lateral rod 132. Next, by respectively mounting one end of the two draw bars 134 to the ends of the lateral rod 132, the connection between the draw bars 134 and the lateral rod 132 is implemented, so is the connection between the cooling components 110 and the draw bars 134.

According to the above described detachment of the malfunctioned cooling component 110a and the mounting procedure of the replaced cooling component 110, the entire procedure is quite simple. Therefore, users may replace the malfunctioned cooling component as fast as possible to improve efficiency.

Figure 14:
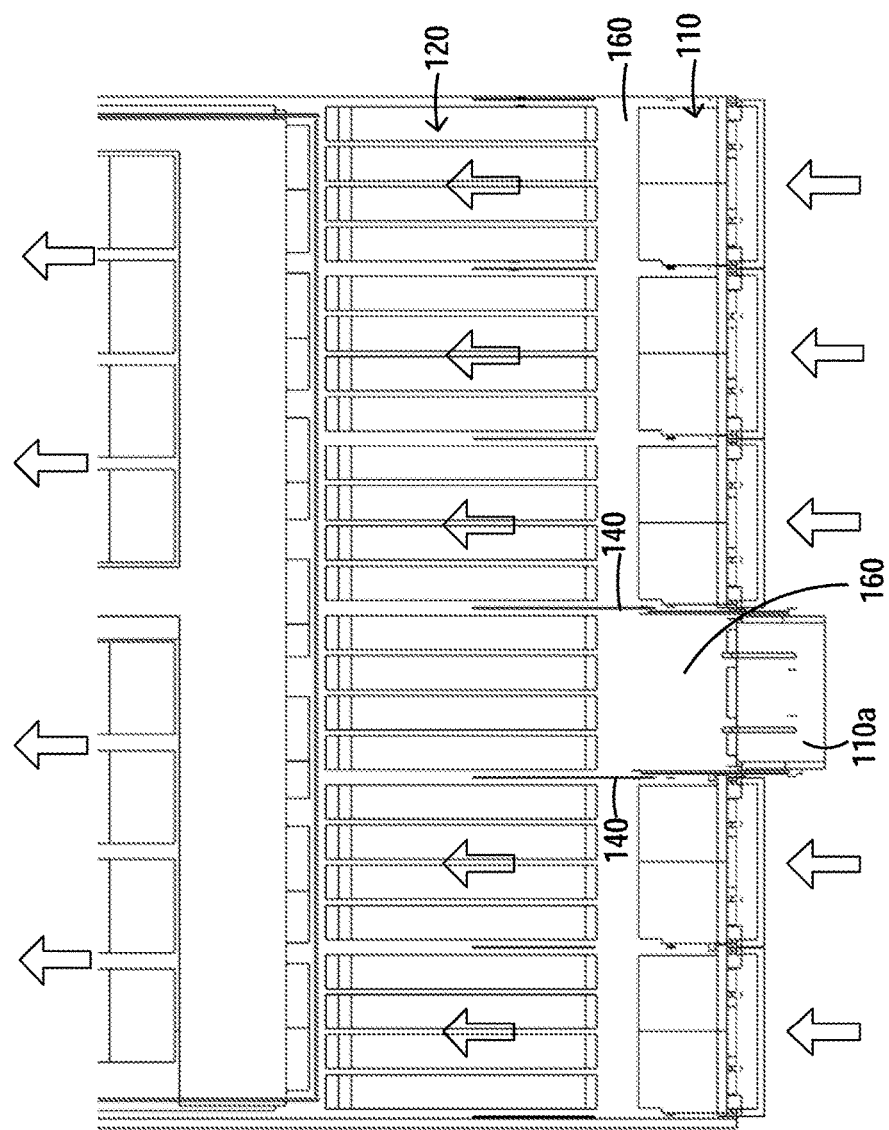
FIG. 14 illustrates a schematic diagram of airflow of the apparatus integrated with cooling components when one malfunctioned cooling component therein is being maintained according to one embodiment of the present disclosure.

FIG. 14 illustrates a schematic diagram of the airflow of the apparatus integrated with cooling components when one malfunctioned cooling component therein is being maintained according to one embodiment of the present disclosure. As shown in FIG. 14, when one malfunctioned cooling component 110a therein is being maintained or flipped, the two baffles 140 corresponding to the malfunctioned cooling component 110a will move in a direction towards the cooling component 110a from the position between the heat generating components 120. At this time, the two baffles 140 will close the lateral sides of the gap space 160 between the corresponding cooling component 110a and the heat generating component 120. In this scenario, the airflow from the adjacent gap spaces will not leak from the opening caused by the cooling component 110a being maintained or flipped, which ensures that the heat dissipation of the heat generating components 120 of other parts inside the housing of the apparatus 100 would be substantially not affected.

According to the apparatus 100 integrated with cooling components of the present disclosure, apart from the convenient maintenance for the malfunctioned cooling component 110a, the malfunctioned heat generating components 120 may also be maintained by means of the manipulation through the opening caused by the flipped cooling components 110.

Figure 15:
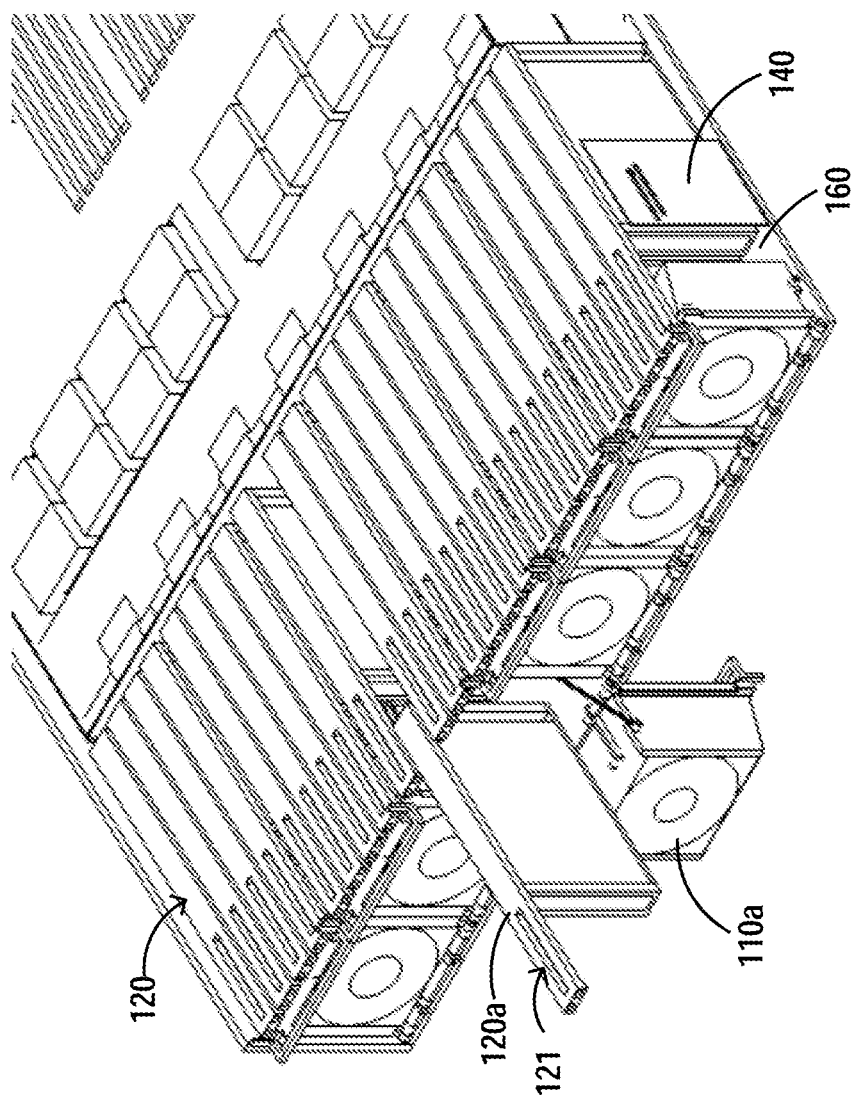
FIG. 15 illustrates a structural diagram of the apparatus integrated with cooling components when one malfunctioned heat generating component therein is being maintained according to one embodiment of the present disclosure.
Figure 16:
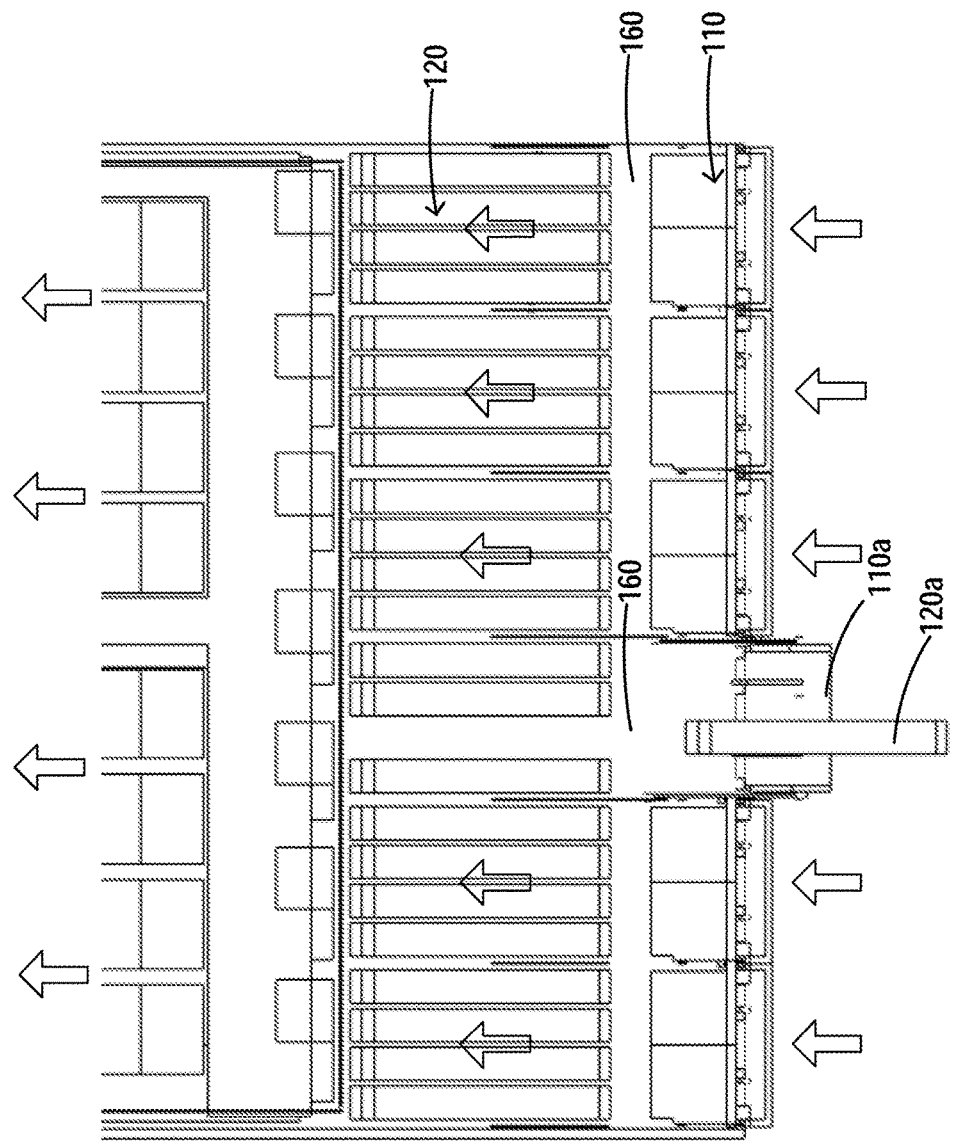
FIG. 16 illustrates a schematic diagram of airflow of the apparatus integrated with cooling components when one malfunctioned heat generating component therein is being maintained according to one embodiment of the present disclosure.

FIG. 15 illustrates a structural diagram of the apparatus integrated with cooling components when one malfunctioned heat generating component therein is being maintained according to one embodiment of the present disclosure. FIG. 16 illustrates a schematic diagram of the airflow of the apparatus integrated with cooling components when one malfunctioned heat generating component therein is being maintained according to one embodiment of the present disclosure.

As shown in FIG. 15, when the heat generating component 120a breaks down, the cooling component 110a corresponding to the malfunctioned heat generating component 120a may be opened and the malfunctioned heat generating component 120a may be fetched from the housing of the apparatus 100 by releasing the snap-fit structure 121. As can be seen, by means of the flipping operations of the cooling components 110, it is convenient to maintain (such as replace) the malfunctioned heat generating component 120a. At this time, the airflow diagram shown in FIG. 16 is basically similar to the airflow diagram when one malfunctioned cooling component 110a therein is being maintained as represented in FIG. 14.

Through the above description, it is understood that one aspect of the present disclosure is providing an apparatus integrated with cooling components. By means of the structure design of the apparatus integrated with cooling components of the present disclosure, the users may conveniently maintain the malfunctioned cooling components and/or heat generating components and keep other cooling components and other heat generating components in normal operation and basically free from impact, which improves maintenance efficiency for the users and simultaneously enhance operating performance of the device. Another aspect of the present disclosure provides an electronic or electrical device, which may include the above described apparatus integrated with cooling components. The electronic or electrical device may include a device, such as a disk cabinet, a server and the like. A further aspect of the present disclosure provides a method for maintaining the above described apparatus. The method may at least include the following steps of: flipping the cooling components towards the outside of the apparatus; and decoupling the cooling components or the heat generating components from the housing of the apparatus. It should be noted that the above described various embodiments and advantageous effects for the apparatus integrated with cooling components also apply to the method provided by the further aspect of the present disclosure.

Although the present invention has been explained and described in details in the drawings and the above description, the explanations and descriptions should be regarded as illustrative or exemplary instead of restrictive; the present invention is not limited to the embodiments disclosed herein. While practicing the claimed invention, those skilled in the art can understand and perform other variants of the embodiments disclosed herein through studying the drawings, the disclosure and the attached claims.

In the claims, the word "include" does not exclude other elements and the indefinite article "a" or "an" does not exclude plural forms. A single element or other units may satisfy the function of a plurality of items as recited in the claims. The mere fact that certain measures are recited in mutually different embodiments or dependent claims does not indicate that a combination of these measures cannot be used to an advantage. Without deviating from the spirit and the scope of the present application, the protective scope of the present applicant covers any possible combinations of various features recited in various embodiments or dependent claims. Any reference numerals in the claims should not be interpreted as restrictions on the present invention.

Any reference numerals in the claims should not be understood as restrictions over the scope of the present invention.

What is claimed is:

1. An apparatus, comprising:
   a housing;
   at least one heat generating component coupled to the housing;
   at least one cooling component coupled to the housing for delivering a cooling airflow to the at least one heat generating component, the at least one cooling component arranged along one end of the housing and upstream of the at least one heat generating component along a direction of the airflow generated by the at least one cooling component, the at least one cooling component separated from the at least one heat generating component by a gap space, the at least one cooling component movably mounted relative to the housing to transition between a first state and a second state; and
   at least a first baffle adjacent one side of the at least one cooling component, the first baffle moveable between a retracted position, corresponding to the first state of the at least one cooling component, wherein the first baffle is retracted to expose the gap space, and an extended position, corresponding to the second state of the at least one cooling component, wherein the first baffle at least partially extends across the gap space to at least partially close the gap space on the one side of the at least one cooling component.

2. The apparatus of claim 1, including a second baffle adjacent an opposed side of the at least one cooling component, the second baffle moveable between a retracted position, corresponding to the first state of the at least one cooling component, wherein the second baffle is retracted to expose the gap space, and an extended position, corresponding to the second state of the at least one cooling component, wherein the second baffle at least partially extends across the gap space to at least partially close the gap space on the opposed side of the at least one cooling component.

3. The apparatus of claim 2, wherein the at least one cooling component is pivotally mounted to the housing and pivots between the first state and the second state to cause corresponding movement of the first baffle and the second baffle between the retracted position and the extended position.

4. The apparatus of claim 3, including:
   a plurality of cooling components arranged in a row on the one end of the housing and a plurality of heating components arranged in a row at least partially within the housing and being separated by the gap space, with individual ones of the cooling components corresponding to respective individual ones of the heating components; and
   wherein each cooling component includes an individual baffle on each side of the respective cooling component.

5. The apparatus of claim 4, further comprising:
   an interface circuit board comprising an interface extending in proximity to the cooling components and supporting hot-plug connection with the cooling components.

6. The apparatus of claim 4, wherein the cooling components comprise fans, and the heat generating components comprise storage.

7. The apparatus of claim 4, wherein the apparatus is a disk cabinet.

8. The apparatus of claim 4, wherein the apparatus is implemented as an electronic device.

9. The apparatus of claim 4, wherein an adjacent pair of cooling components share a common baffle.

10. The apparatus of claim 3, wherein when in the first state of the at least one cooling component, the at least one cooling component is pivoted away from the housing to permit one of access to, or removal of, the at least one cooling component or the at least one heating component.

11. An apparatus, comprising:
heat generating components;
cooling components for delivering a cooling airflow to the heat generating components, the cooling components arranged along one side of the apparatus and upstream of the heat generating components along a direction of the airflow generated by the cooling components, the cooling components being rotatable towards outside of the apparatus to expose the heat generating components;
a rotary connecting structure arranged to detachably connect the cooling components to a bottom plate of the apparatus, the rotary connecting structure comprising a rotating rod secured onto the bottom plate of the apparatus and pivotally connecting the cooling components to the bottom plate; and
a plurality of baffles, at least one of the baffles arranged on each side of each of the cooling components;
wherein during the rotation of the cooling components towards the outside of the apparatus, the baffles are operable to slide to laterally close a gap space between the respective cooling components and the heat generating components.

12. The apparatus of claim 11, wherein the rotary connecting structure further comprises a plurality of draw bars for connecting the cooling components to the plurality of baffles, each draw bar being secured onto the cooling component on one end and slidably mounted in a slot on the baffle on the other end.

13. The apparatus of claim 12, wherein the rotary connecting structure further comprises a lateral rod disposed at a bottom of the cooling components, wherein two ends of the lateral rod protrude from respective vias at two sides of the cooling components and are connected to the draw bars located at the two sides of the cooling components.

14. The apparatus of claim 13, wherein the rotary connecting structure further comprises a control rod arranged to apply a releasing operation on at least one of the rotating rod and the lateral rod to release the cooling components from the rotating rod and/or the lateral rod, so that the cooling components are decoupled from the rotary connecting structure.

15. The apparatus of claim 14, wherein the rotating rod and the lateral rod each comprise springs provided therein, the springs being capable of causing two ends of the rotating rod and the lateral rod to retract inwardly in response to the releasing operation of the control rod, so that the cooling components are decoupled from the rotary connecting structure.

16. A method for maintaining an apparatus comprising heat generating components and cooling components disposed along one side of the apparatus, the cooling components arranged upstream of the heat generating components along a direction of an airflow generated by the cooling components, the method comprising:
flipping the cooling components towards outside of the apparatus; and
decoupling the cooling components or the heat generating components from a housing of the apparatus;
wherein the apparatus further comprises a plurality of baffles, at least first and second baffles disposed adjacent respective first and second sides of the cooling components; and
wherein in conjunction with flipping the cooling components towards the outside of the apparatus, the at least first and second baffles slide to laterally close a gap space between the respective cooling components and the heat generating components.

17. The method of claim 16, wherein decoupling the cooling components includes utilizing detachably connecting rotary connecting structure arranged to detachably connect the cooling components to a bottom plate of the apparatus.

18. The method of claim 17, wherein the rotary connecting structure comprises a rotating rod secured onto the bottom plate of the apparatus and pivotally connecting the cooling components to the bottom plate, and wherein flipping the cooling components includes pivoting the cooling components via the rotating rod.

19. The method of claim 16, wherein the heat generating components and the cooling components are arranged between the bottom plate and a top plate parallel with the bottom plate, and further including:
detachably connecting the heat generating components to the top plate via a snap-fit structure.

20. The method of claim 16, including arranging the cooling components in rows along one side of the apparatus;
wherein each of the cooling components corresponds to a plurality of heat generating components.

* * * * *